(12) United States Patent
Kagan et al.

(10) Patent No.: US 6,646,285 B1
(45) Date of Patent: Nov. 11, 2003

(54) MOLECULAR ELECTRONIC DEVICE USING METAL-METAL BONDED COMPLEXES

(75) Inventors: Cherie R Kagan, Ossining, NY (US); Chun Lin, Croton-On-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/117,789

(22) Filed: Apr. 5, 2002

(51) Int. Cl.$^7$ .......................... H01L 35/24; H01L 51/00
(52) U.S. Cl. .............................. 257/40; 257/23; 257/24; 257/17; 438/99
(58) Field of Search .......................... 438/99, 149, 158, 438/216, 240, 287, 785; 257/40, 23, 24, 17

(56) References Cited

U.S. PATENT DOCUMENTS

| | | | | |
|---|---|---|---|---|
| 5,152,805 A | * | 10/1992 | Geddes et al. | 29/25.02 |
| 5,217,792 A | | 6/1993 | Chidsey et al. | 428/207 |
| 5,326,626 A | | 7/1994 | Chidsey et al. | 427/301 |
| 6,128,214 A | | 10/2000 | Kuckes et al. | 365/151 |
| 6,198,655 B1 | | 3/2001 | Heath et al. | 365/151 |
| 6,314,019 B1 | | 11/2001 | Kuckes et al. | 365/151 |
| 2001/0054709 A1 | | 12/2001 | Heath et al. | 257/25 |
| 2002/0167003 A1 | * | 11/2002 | Campbell et al. | 257/40 |

OTHER PUBLICATIONS

Malcolm H. Chisholm, "One–Dimensional Polymers and Mesogens Incorporating Multiple Bonds Between Metal Atoms", American Chemical Society, 2000.

Larry M. Hall, Robert J. Speer, and Helen J. Ridgway, "Synthesis and Antitumor 'Activity' of certain Rhodium (II) Carboxylates", Institute of Molecular Medicine, vol. 10, No. 1, 1980.

Michael P. Doyle, "Chiral Dirhidium Carboxamidates: Catalysts for Highly Enantioselective Syntheses of Lactones and Lactams", Trinity University.

Daniel G. Nocera, "The Chemistry of Multielectron Excited States", American Chemical Society, 1995.

Guang Cao, Hun–Gi Hong and Thomas E. Mallouk, "Layered Metal Phosphates and Phosphates: From Crystals to Monolayers", American chemical Society, 1992.

Gero Decher, "Fuzzy Nanoassemblies: Toward Layered Polymeric Multicomposites", www.sciencemag.gov, vol. 277, Aug. 29, 1997.

Michael A. Ansell, Elizabeth B. Cogan and Catherine J. Page, "Coordinate Covalent Cobalt–Diisocyanide Multilayer Thin Films Grown One Molecular Layer at a Time", American Chemical Society, Nov. 27, 1999.

* cited by examiner

Primary Examiner—Phat X. Cao
Assistant Examiner—Thao X. Le
(74) Attorney, Agent, or Firm—Ohland, Greeley, Ruggiero & Perle, L.L.P.; Wan Yer Chaung

(57) ABSTRACT

The present invention provides a molecular device including a source region and a drain region, a molecular medium extending there between, and an electrically insulating layer between the source region, the drain region and the molecular medium. The molecular medium in the molecular device of present invention is a thin film having alternating monolayers of a metal—metal bonded complex monolayer and an organic monolayer.

26 Claims, 12 Drawing Sheets

MOLECULAR ELECTRONIC DEVICE USING METAL-METAL BONDED COMPLEXES

BACKGROUND OF THE INVENTION

1. Field of the Invention

The present invention relates to a molecular device including a source region and a drain region, a molecular medium extending there between, and an electrically insulating layer between the source region, the drain region and the molecular medium. More particularly, the present invention relates to a molecular device in which the molecular medium is a thin film having alternating monolayers of a metal—metal bonded complex monolayer and an organic monolayer.

2. Description of the Prior Art

During the past three decades, considerable progress has been made in the understanding of dinuclear compounds containing multiple metal—metal bonds. Both the experimental and the theoretical aspects of these compounds have been explored extensively. These studies have provided a large body of information particularly in the following areas: the reactivities of the dinuclear cores, the strengths of metal—metal interactions, the electronic transitions between metal-based orbitals and those involving metal to ligand charge transfer, the redox activities of the dinuclear core, and the correlation among these properties (See, e.g., Cotton, Walton, Multiple Bonds Between Metal Atoms, 2nd Ed., Oxford, 1993).

Efforts focusing on technologically important applications of dinuclear compounds have led to many promising research areas, such as inorganic liquid crystals (See, e.g., Chisholm, Acc. Chem. Res., 2000, 33, 53), antitumor agents (See, e.g., Hall, et al, J. Clin. Hematol. Oncol., 1980, 10, 25), and homogeneous and photolytic catalysis (See, e.g., Doyle, Aldrichimica Acta, 1996, 29, 3; Nocera, Acc. Chem. Res., 1995, 28, 209).

Layer-by-layer assembly techniques to fabricate multi-component films has been explored in the literature. One of the most developed systems grown layer-by-layer is the layered metal phosphates and phosphonates. The films include multivalent metal ions, e.g. $Zr^{4+}$, and organic molecules terminated with an acidic functionality, e.g. a phosphonic acid (See, e.g., Cao, Hong, Mallouk, Acc. Chem. Res., 1992, 25, 420). Katz and co-workers have used this method to align hyperpolarizable molecules into polar multilayer films that show second-order nonlinear optical effects (See, e.g., U.S. Pat. Nos. 5,217,792 and 5,326,626). A similar approach has also been extended to other materials such as polymers, natural proteins, colloids, and inorganic clusters (See, e.g., Decher, Science, 1997, 277, 1232). This same technique has also been applied to the production of other multilayers including Co-diisocyanide, dithiols with Cu, and pyrazines with Ru (See, e.g., Page, Langmuir, 2000,16, 1172).

Among the existing examples, the driving force for the film progression is mainly the electrostatical interaction between polycations and polyanions; few examples involve other types of interactions, such as hydrogen bond, covalent, or mixed covalent-ionic. The present invention utilizes strong covalent interactions, rather than ionic interactions, between the metals and the ligands in a novel strategy to assemble nearly perfectly packed mutilayers.

Despite the abundance of activity in these areas, these efforts have been limited to the study and use of the metal—metal bonded compounds in solution-based systems. To harness the electronic, optical, and magnetic properties of metal—metal bonded materials in solid-state applications and devices, development of new methods for making thin films containing functional metal—metal bonded complexes are needed.

Accordingly, the present invention provides a molecular electronic device having a drain region, a molecular medium extending there between, and an electrically insulating layer between the source region, the drain region and the molecular medium. The molecular medium in the molecular device according to the present invention is a thin film having alternating monolayers of a metal—metal bonded complex monolayer and an organic monolayer prepared by layer-by-layer growth.

SUMMARY OF THE INVENTION

The present invention provides a molecular device including:
  a source region and a drain region;
  a molecular medium extending between the source region and the drain region; and
  an electrically insulating layer between the source region, the drain region and the molecular medium.

The present invention further provides a molecular device including:
  a source region and a drain region;
  a molecular medium extending between the source region and the drain region, the molecular medium including a thin film having alternating monolayers of a metal—metal bonded complex monolayer and an organic monolayer prepared by layer-by-layer growth;
  a gate region disposed in spaced adjacency to the molecular medium, and
  an electrically insulating layer between the gate region and the source region, the drain region and the molecular medium.

The present invention still further provides a molecular device including:
  a source region and a drain region;
  a molecular medium extending between the source region and the drain region, the molecular medium including a thin film having alternating monolayers of a metal—metal bonded complex monolayer and an organic monolayer prepared by layer-by-layer growth; and
  an electrically insulating layer between the gate region and the source region, the drain region and the molecular medium.

DETAILED DESCRIPTION OF THE INVENTION

Figure 1:
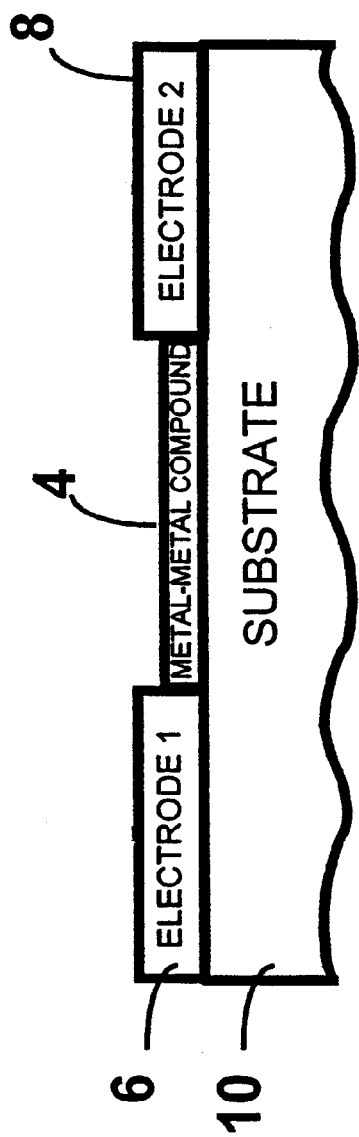
FIG. 1 shows a 2-terminal lateral device structure incorporating a metal—metal bonded layer as the active switching medium between two electrodes.

The present invention makes use of a molecular medium, which includes alternating monolayers of a metal—metal bonded complex monolayer and an organic monolayer prepared by layer-by-layer growth as the active switching medium in two- and three-terminal electronic devices. Such alternating monolayers of metal—metal bonded complexes and organic compounds are molecular scale composites of metal—metal bonded and organic layers. As a result, these materials offer rich electrochemistry and electronic properties for electronic device applications, while being simple and easy to process at room temperature by methods, such as, low-cost deposition from solution.

These complexs may be deposited from solution by techniques such as spin-coating or by systematic layer-by-layer assembly. The low-cost, solution based deposition is compatible with inexpensive, large area electronic applications. In addition, the low-temperature deposition conditions are compatible with a variety of substrate materials, including plastics, for flexible electronic applications.

The present invention provides a molecular electronic device having a thin-film of alternating monolayers of a metal—metal bonded complex monolayer and an organic monolayer prepared by layer-by-layer growth of the thin-film.

The molecular device includes a source region and a drain region; a molecular medium extending between the source region and the drain region; and an electrically insulating layer between the source region, the drain region and the molecular medium.

In one embodiment, the source region, the drain region and the molecular medium disposed there between are disposed in a vertical arrangement on an insulating material, which is a substrate.

In another embodiment, the molecular device further includes a gate region disposed between the substrate, the insulator, the source region, the drain region and the molecular medium.

In still another embodiment, the molecular medium in the molecular is a molecular switching medium.

In yet another embodiment, the thin film is prepared by a process including the steps of:

(a) applying onto a surface of a substrate solution including:
  (i) a metal—metal bonded complex selected from the group consisting of compounds represented by the following formulas:

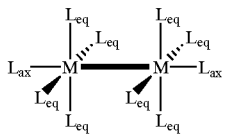
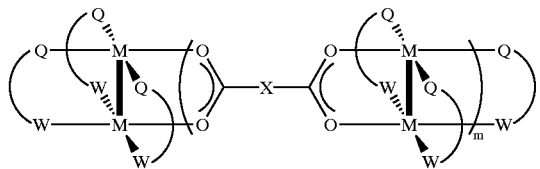
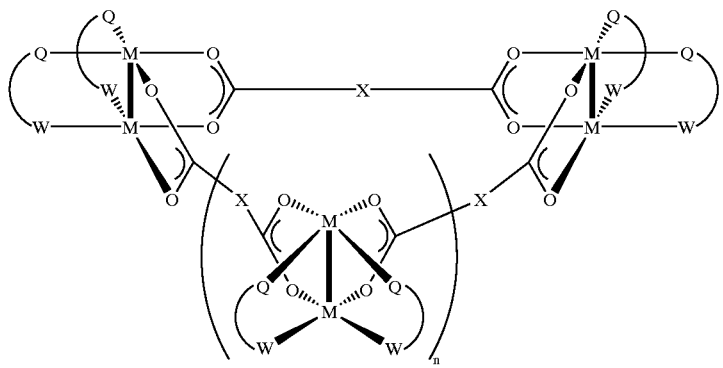

and a combination thereof; wherein:

$L_{ax}$ is an axial ligand;

$L_{eq}$ is an equatorial ligand; wherein two equatorial ligands together form a bidentate ligand

wherein each

is independently selected from the group consisting of:

N⌢N, N⌢O, O⌢N, N⌢S, S⌢N,
N⌢P, P⌢N, O⌢S, S⌢O, O⌢O,
P⌢P and S⌢S ligands;

M is a transition metal;
wherein

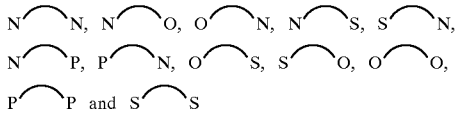

is a bridging group each selected independently from the group consisting of: $SO_4^{2-}$, $MoO_4^{2-}$, $WO_4^{2-}$, $ZnCl_4^{2-}$ and a dicarboxylate; and wherein m is an integer from 1 to 25, and n is 0 to 6;

(ii) a linker compound represented by the formula:

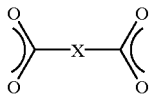

wherein G3 and G4 are the same or different functional groups capable of interacting with a metal—metal bonded complex; and $Linker_b$ is a single bond or a difunctional organic group bonded to G3 and G4; and (iii) a solvent; and (b) evaporating the solvent to produce a thin film of molecular medium on the substrate.

The processes described herein include layer-by-layer growth of thin films having alternating monolayers of metal—metal bonded complexes and organic molecules. Such films have utility in solid-state applications.

The films are prepared by repeated sequential depositions of metal—metal bonded units, e.g., dirhodium tetraformamidinate complexes, on a prefunctionalized substrate, followed by a proper organic linker, e.g., dipyridyl organic molecules, for the next deposition sequence.

The deposition method is a self-assembling, tunable and stepwise process. Upon application onto a substrate, the complexes are adsorbed on the substrate. Thereafter, an organic monolayer is applied. Thus, repeating the steps, a stepwise layer by layer growth of the thin films can be achieved.

The multi-layered thin films can be grown layer-by-layer to the desired thickness. The process includes the following steps:

(1) applying onto a surface of a substrate a first linker compound represented by the formula:

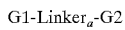

to produce a primer layer of the first linker compound on the substrate, wherein G1 is a functional group capable of interacting with the surface of the substrate; G2 is a functional group capable of interacting with a metal—metal bonded complex; and $Linker_a$ is a difunctional organic group bonded to G1 and G2;

(2) applying onto the primer layer a layer of a metal—metal bonded complex to produce a metal—metal bonded complex monolayer on the primer layer; the metal—metal bonded complex being selected from the group consisting of compounds represented by the following formulas:

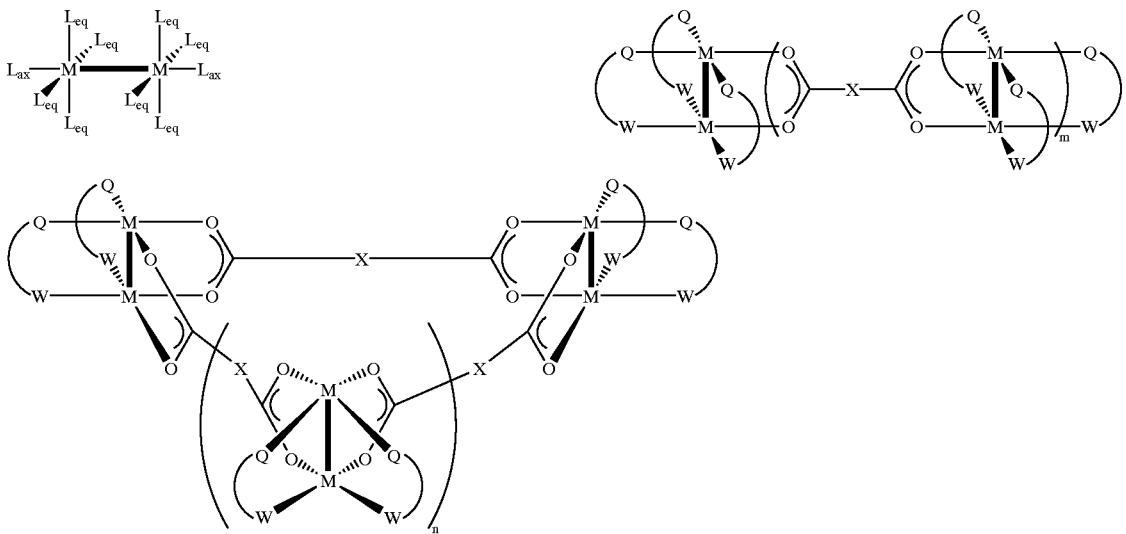

and a combination thereof; wherein:
$L_{ax}$ is an axial ligand;
$L_{eq}$ is an equatorial ligand; wherein two equatorial ligands together form a bidentate ligand

wherein each

is independently selected from the group consisting of:

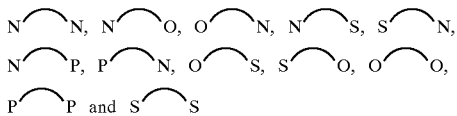

ligands;
M is a transition metal;
wherein

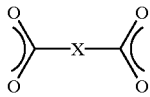

is a bridging group each independently selected from the group consisting of: $SO_4^{2-}$, $MoO_4^{2-}$, $WO_4^{2-}$, $ZnCl_4^{2-}$ and a dicarboxylate; and wherein m is an integer from 1 to 25, and n is 0 to 6;

(3) applying onto the metal—metal bonded complex monolayer a second linker compound represented by the formula:

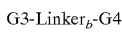

to produce on the metal—metal bonded complex monolayer an organic monolayer; wherein G3 and G4 are the same or different functional groups capable of interacting with a metal—metal bonded complex; and $Linker_b$ is a single bond or a difunctional organic group bonded to G3 and G4; and optionally (4) sequentially repeating steps (2) and (3) at least once to produce the layer-by-layer grown thin film having alternating monolayers of a metal—metal bonded complex monolayer and an organic monolayer.

The length, functionality, direction of metal—metal vector, and other physical and chemical properties of each layer can be tuned by varying the metal—metal bonded units and the organic linkers. Preferably, the thin film has from 1 to 100 alternating monolayers of a metal—metal bonded complex monolayer and an organic monolayer. More preferably, the thin film has from 30 to 40 alternating monolayers of a metal—metal bonded complex monolayer and an organic monolayer.

The films are deposited from liquid solutions and therefore they may be deposited on substrates having diverse topography and configuration.

The following illustration describes the layer-by-layer growth methods used according to the present invention to fabricate metal—metal bonded compounds on a substrate.

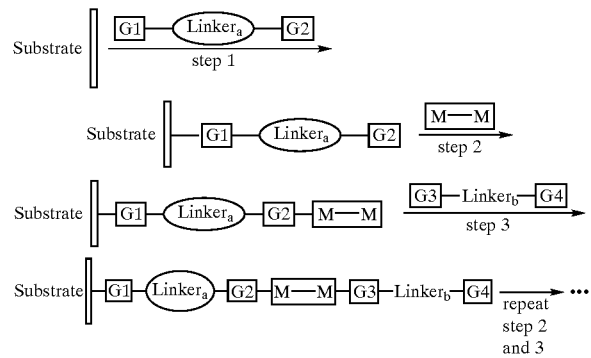

As a substrate, any suitable material can be used. Suitable substrates include, for example, a metal, a metal oxide, a semiconductor, a metal alloy, a semiconductor alloy, a polymer, an organic solid, and a combination thereof. The form of the substrates can be a planar solid or a non-planar solid such as a stepped or curved surface.

The following preferred substrates have been demonstrated: Au, ITO and $SiO_2$.

G1-Linker$_a$-G2 groups are suitable molecular species that can form a self-assembled monolayer include organic molecular species having a functional group G1 capable of interaction with the surface of the substrate forming a coated surface.

Examples of this group that can be designed into molecules for interacting with or binding to a particular substrate surface with chemical specificity include one or more of the same or different functional groups, such as phosphine oxide, phosphite, phosphate, phosphazine, azide, hydrazine, sulfonic acid, sulfide, disulfide, aldehyde, ketone, silane, germane, arsine, nitrile, isocyanide, isocyanate, thiocyanate, isothiocyanate, amide, alcohol, selenol, nitro, boronic acid, ether, thioether, carbamate, thiocarbamate, dithiocarbamate, dithiocarboxylate, xanthate, thioxanthate, alkylthiophosphate, dialkyldithiophosphate or a combination thereof.

Functional group G2 on the tran direction of G1 is capable of interaction with the next layer metal—metal boned molecules. Examples of this group that can be designed into molecules for interacting with or binding to a particular metal—metal bonded molecule with chemical specificity include one or more of the same or different functional groups. Thus, G2 in the first linker compound can independently be: 4-pyridyl, 3-pyridyl, cyano, 4-cyanophenyl, 3-cyanophenyl, perfluoro-3-cyanophenyl and perfluoro-4-cyanopheny.

There are two types of these molecules, G2a and G2b. G2a is used for the axial direction linkage, such as nitrile, pyridyl, trimethylsilane compounds; and the G2b is used for the equatorial direction linkage, such as some bridging bidentate ligands with (N,N), (N,O), (O,O), (O,S), (P,P), (N,S), and (S,S) donor sets. Some typical examples of bidentate ligands are amidinates that are a (N,N) donor set, acetamides that are a (N,O) set, carboxylates that are a (O,O) set, thiocarboxylates that are a (O,S) set, diphosphines that are a (P,P) set, mercaptopyrimidines that are a (N,S) set, and dithiocarboxylates that are a (S,S) set.

The following molecules have been demonstrated:

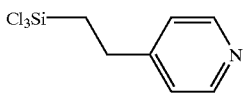

on oxides surfaces, and

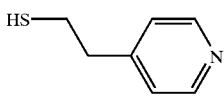

on Au surface.

III.

are suitable molecules containing at least one metal—metal bonded unit.

1. If the first monolayer ends with G2a group, examples of these metal—metal bonded complexs can be containing one or more than one metal—metal bonded units of which axial direction can interact with or bind to G2a group, such as the molecules containing one or more than one of the following metal—metal bonded cores: $Cr_2^{4+}$, $Mo_2^{4+}$, $Re_2^{6+}$, $Re_2^{5+}$, $Re_2^{4+}$, $Ru_2^{5+}$, $Ru_2^{6+}$, $Rh_2^{4+}$. Preferred molecules suitable for use as the molecular species that can interact with or bind to G2a group include: tetrakis(carboxylato) dichromium, tetrakis(carboxylato)dimolybdenum, tetrakis(amidinato)dichlorodirhenium, tetrakis(amidinato) chlorodiruthenium, tetrakis(carboxylato)dirhodium, tetrakis(amidinato)dirhodium, bis(carboxylato)bis(amidinato) dirhodium, and complexes containing more than one dimetal units.

If the first monolayer ends with G2b group, examples of these metal—metal bonded complexes can be containing one or more than one metal—metal bonded units of which equatorial direction can interact with or bind to G2b group, such as the molecules containing one of the following metal—metal bonded cores: $Cr_2^{4+}$, $Mo_2^{4+}$, $W_2^{4+}$, $Re_2^{6+}$, $Re_2^{5+}$, $Re_2^{4+}$, $Ru_2^{4+}$, $Ru_2^{5+}$, $Ru_2^{6+}$, $OS_2^{6+}$, $Rh_2^{4+}$. Preferred molecules suitable for use as the molecular species that can interact with or bind to G2b group include: tetrakis (carboxylato)dimetal (where the metal is the one of the above), decakis(acetonitrile)dimetal (where the metal is Mo, Re, and Rh).

The molecule that has been demonstrated is: $[Rh_2(cis-N, N'-di-p-anisylformamidinate)_2]_2(O_2CCH_2CO_2)_2$.

are suitable molecules bearing two functional groups at both ends. These functional groups will interact with or bind to the previous metal—metal bonded unit terminated surface. Both G3 and G4 functional groups are every similar to G2.

Thus, G3 and G4 in the second linker compound can independently be 4-pyridyl, 3-pyridyl, cyano, 4-cyanophenyl, 3-cyanophenyl, perfluoro-3-cyanophenyl and perfluoro-4-cyanopheny. Linker$_b$ can be a single bond, an alkylene, an alkenediyl, an alkynediyl, a 1,4-arylene, an arene-1,3,5-triyl, a 1,2,3-triazine-2,4,6-triyl, 4,4',4'',4'''-(21H,23H-porphine-5,10,15,20-tetrayl) and zinc complex of 4,4',4'',4'''-(21H,23H-porphine-5,10,15,20-tetrayl) and a combination thereof. Further examples of G3-Linker$_b$-G4 groups include polynitriles, polypyridyls, ditrimethylsilanes, and organic molecules containing at least two of any of the following donor sets used as bridging bidentate ligands: (N,N), (N,O), (O,O), (O,S), (P,P), (N,S), and (S,S), such as,

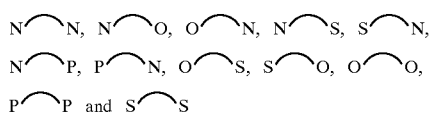

ligands. Some molecules with tetrahedral geometry may also be used as equatorial linkers, such as $SO_4^{2-}$, $MoO_4^{2-}$, $WO_4^{2-}$, $ZnCl_4^{2-}$.

Examples of the second linker compounds include compounds represented by the following formulas:

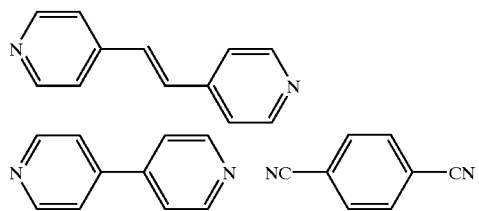

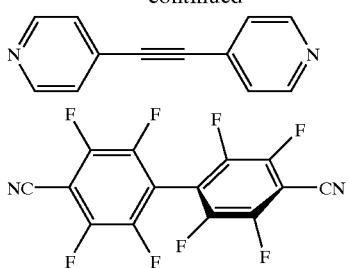

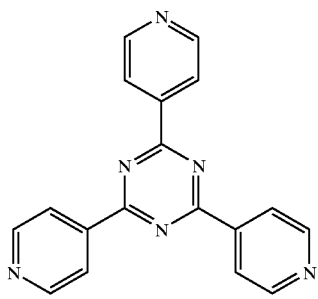

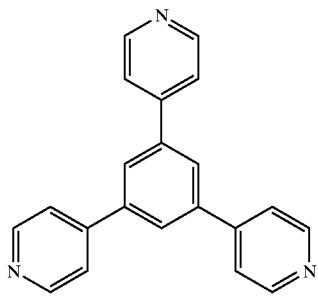

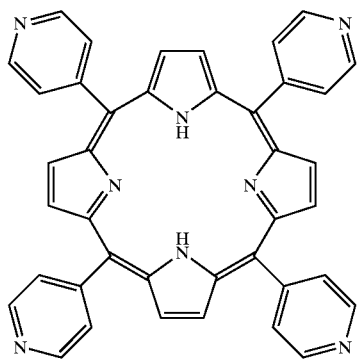

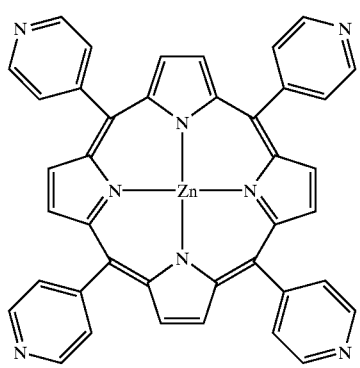

and acetylene or diacetylene linkers represented by the formulas:

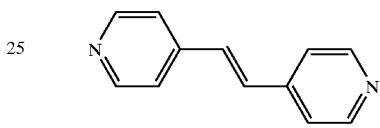

which can be derived from derived from compounds represented by the formula:

$$Me_3Si—C\equiv C—SiMe_3$$

or $$Me_3Si—\equiv\equiv—SiMe_3$$

by desilylation of the trimethylsilyl groups

Preferred molecules carrying at least two required functional groups include:

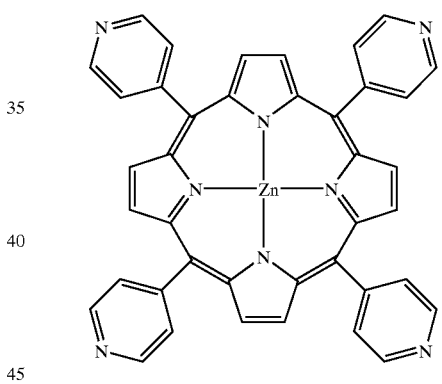

In a preferred embodiment, the process of the present invention includes the steps of:

(1) applying onto a surface of a substrate a first linker compound represented by the formula:

$$G1\text{-}Linker_a\text{-}G2$$

to produce a primer layer of the first linker compound; wherein G1 is selected from the group consisting of: $Cl_3Si$ and SH; G2 is selected from the group consisting of: 4-pyridyl and 4-cyanophenyl; and $Linker_a$ is selected from the group consisting of: $C_1$–$C_8$ alkylene, $C_1$–$C_8$ alkenediyl, $C_1$–$C_8$ alkynediyl and 1,4-arylene;

(2) applying onto the primer layer a metal—metal bonded complex to produce on the primer layer a metal—metal bonded complex monolayer; wherein the metal—metal bonded complex is selected from the group consisting of compounds represented by the following formulas:

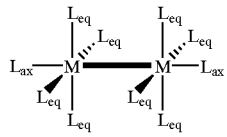
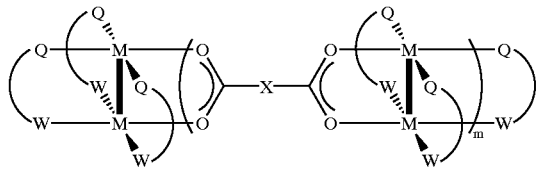
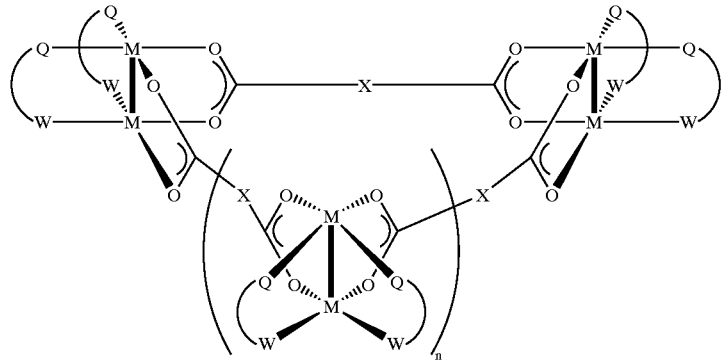

and a combination thereof; wherein:

$L_{ax}$ is an axial ligand;

$L_{eq}$ is an equatorial ligand; wherein two equatorial ligands together form a bidentate ligand

Q⌒W;

wherein each

Q⌒W is independently selected from the group consisting of:

N⌒N, N⌒O, O⌒N, N⌒S, S⌒N, N⌒P, P⌒N, O⌒S, S⌒O, O⌒O, P⌒P and S⌒S ligands;

M is a transition metal;

wherein the group

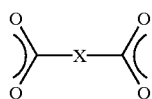

is a dicarboxylate bridging group selected from the group consisting of compounds represented by the formulas:

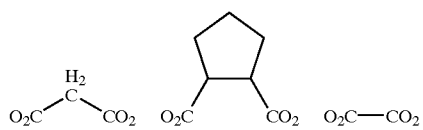

-continued

[structures: $O_2C-C\equiv C-CO_2$; $O_2C-CH=CH-CO_2$; ferrocene dicarboxylate; 1,4-benzene dicarboxylate; tetrafluoro-1,4-benzene dicarboxylate; 4,4'-biphenyl dicarboxylate; cyclohexane dicarboxylate; cubane dicarboxylate; $O_2C-\!\!=\!\!-CO_2$ = $(CH_2)_3C_2(CO_2)_2$; $O_2C-C\!\!\equiv\!\!C-CO_2$ = $B_{10}H_{10}C_2(CO_2)_2$]

and mixtures thereof; and wherein m is an integer from 1 to 12, and n is 0 to 3;

(3) applying onto the metal—metal bonded complex monolayer a second linker compound represented by the formula:

G3-Linker$_b$-G4 to produce on the metal—metal bonded complex monolayer an organic monolayer; wherein G3 and G4 are the same or different functional groups capable of interacting with a metal—metal bonded complex; and Linker$_b$ is a single bond or a difunctional organic group bonded to G3 and G4; and optionally (4) sequentially repeating steps (2) and (3) at least once to produce the layer-by-layer grown thin film having alternating monolayers of a metal—metal bonded complex monolayer and an organic monolayer.

In the first step, the substrates used for film growth can be various kinds of metals, insulators, and semiconductors such as glass, quartz, aluminum, gold, platinum, gold/palladium alloy, silicon, thermally grown silicon dioxide on silicon, and indium-tin-oxide coated glass. Since the films are deposited from liquid solutions, they may be deposited on substrates having diverse topography and configuration. The form of the substrates can be a planar solid or a non-planar solid such as a stepped or curved surface.

The second step of thin film deposition is to treat the modified substrate with an appropriate compound containing at least one metal—metal bonded unit from solution. Metal—metal bond units will interact with N atoms through their axial directions or with bidentate ligands through their equatorial directions. The opposite direction that has not been used to interact with the molecular template will be used as the site for the next step of the layer-by-layer thin film growth. The metal atoms used in the metal—metal bonded units may be any of the following: V, Nb, Cr, Mo, W, Tc, Re, Fe, Ru, Os, Co, Rh, Ir, Ni, Pd, Pt, Cu, Ag.

In the third step, the metal—metal bond unit terminated surface is treated with a solution containing molecules bearing at least two functional groups. For axial linking these functional groups may be any kind of nitrile or pyridyl containing N-donor atoms. Thus, the organic molecules will be polypyridyls, polynitriles, or will contain both pyridyl and nitrile functionalities. For equatorial linkers, they can be organic molecules containing at least two of any of the following donor sets used as bridging bidentate ligands: (N,N), (N,O), (O,O), (N,P), (P,P), (N,S), and (S,S). Some molecules with tetrahedral geometry may also be used as equatorial linkers, such as $SO_4^{2-}$, $MoO_4^{2-}$, $WO_4^{2-}$, $ZnCl_4^{2-}$.

The next step is to repeat the above two steps to add additional layers, but the metal—metal bonded units and organic linkers are not required to be the same, as long as they have a similar structural moiety. This provides a versatile means of assembling multilayer heterostructures from various metal—metal bonded building blocks, with essentially any desired sequence of layers.

The scheme below illustrates an example of multilayer thin film growth including of alternating layers of the redox active metal—metal bonded supramolecules [Rh$_2$(DAniF)$_2$]$_2$(O$_2$CCH$_2$CO$_2$)$_2$ (DAniF=N,N'-di-p-anisyl-formamidinate), 1, and trans-1,2-bis(4-pyridyl)ethylene, 2, on pyridyl functionalized oxide substrates, such as quartz, indium-tin-oxide (ITO), and silicon wafers that have a native or thermally grown silicon dioxide surface.

The oxide substrates were cleaned as follows: each substrate was first treated in UV/ozone for 30 min., then rinsed thoroughly with acetone, dichloromethane, and water, and then dried in an oven at 120° C. for at least 2 h. The substrate was treated again in UV/ozone for another 30 min. right before film deposition.

Substrates were first silated by immersion in a toluene solution containing 1 mM 4-[2-(trichlorosilyl)]-ethylpyridine for 30 min. After rinsing with copious amounts of toluene and ethanol, the substrates were vacuum-dried. Metal—metal bonded molecular films were grown by first dipping the substrates into a 0.1 mM toluene solution of molecule 1 for 2 h at −15° C. and then in a 0.1 mM ether solution of 2 for 30 min at room temperature, with rinsing between steps.

After the first bilayer was deposited, the procedure was repeated, but with the soaking time reduced to 1 min for each solution, until the desired number of bilayers had been obtained.

These steps can be schematically represented as follows:

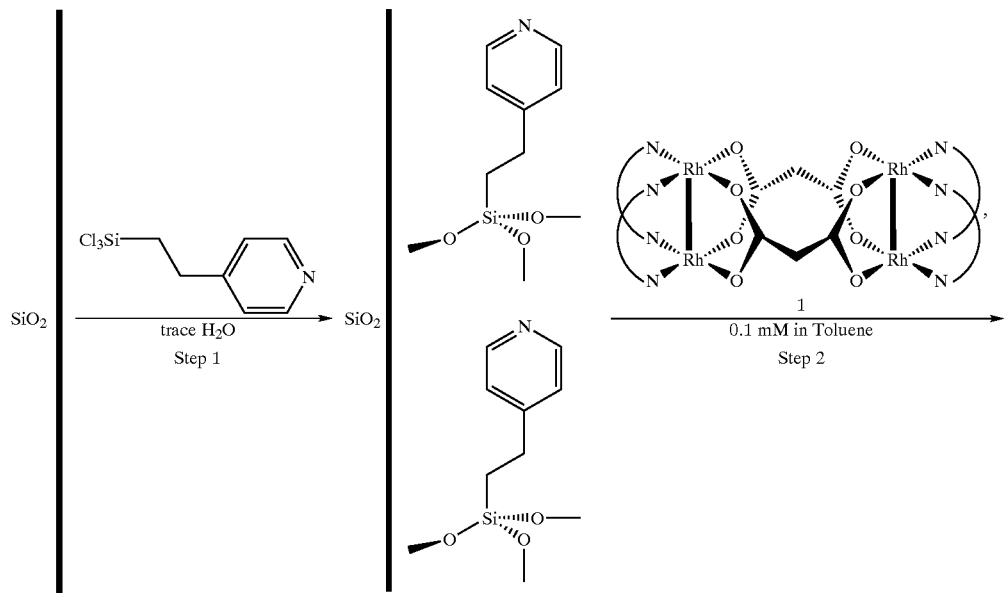

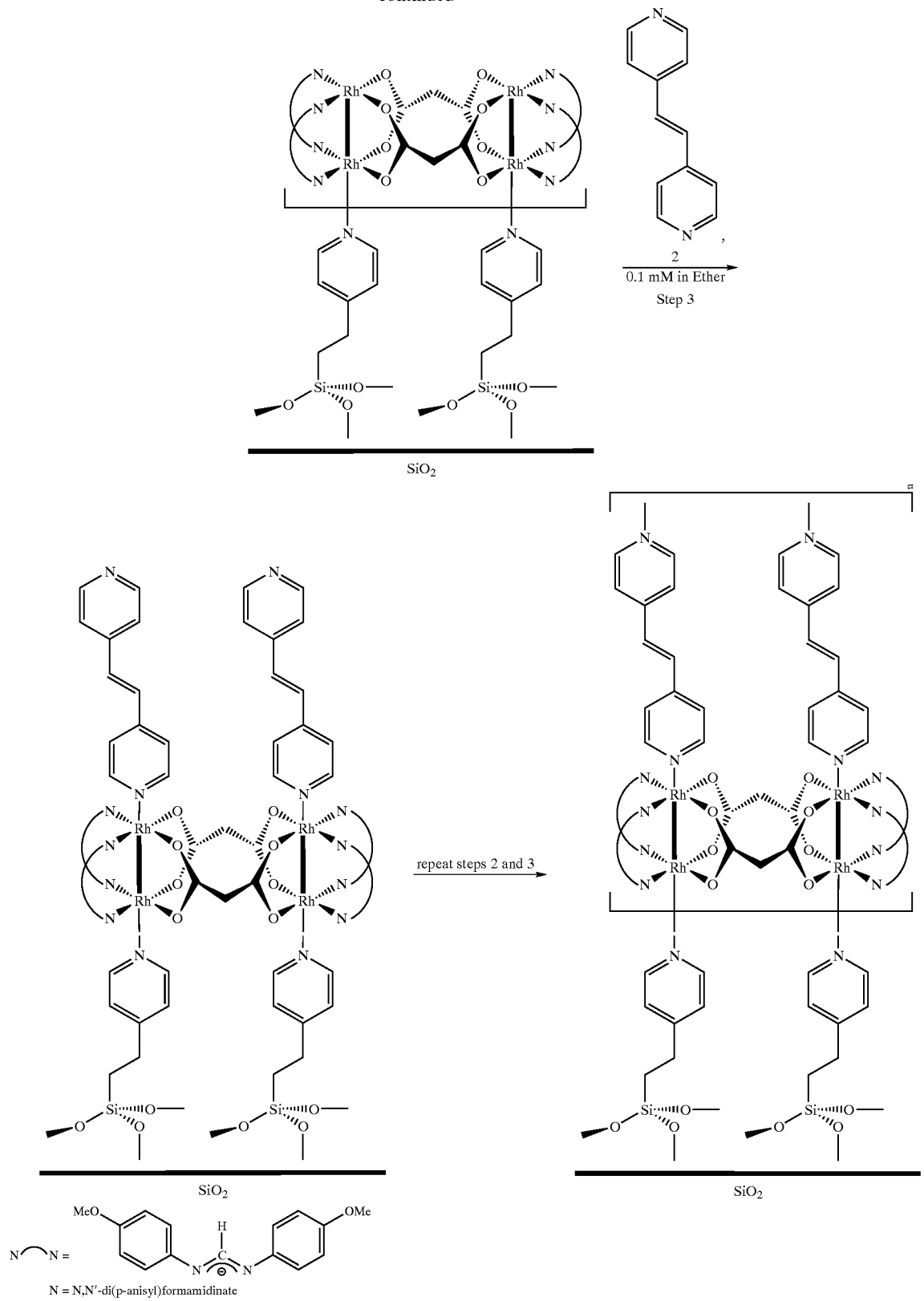
FIG. 1 shows a cross-sectional view of a typical two-terminal lateral electronic device having a substrate 10. The device includes a metal-metal bonded complex material layer 4. Layer 4 is a metal-metal bonded complex and serves as the active switching medium between the electrodes 6 and 8 fabricated on substrate 10.

Figure 2:
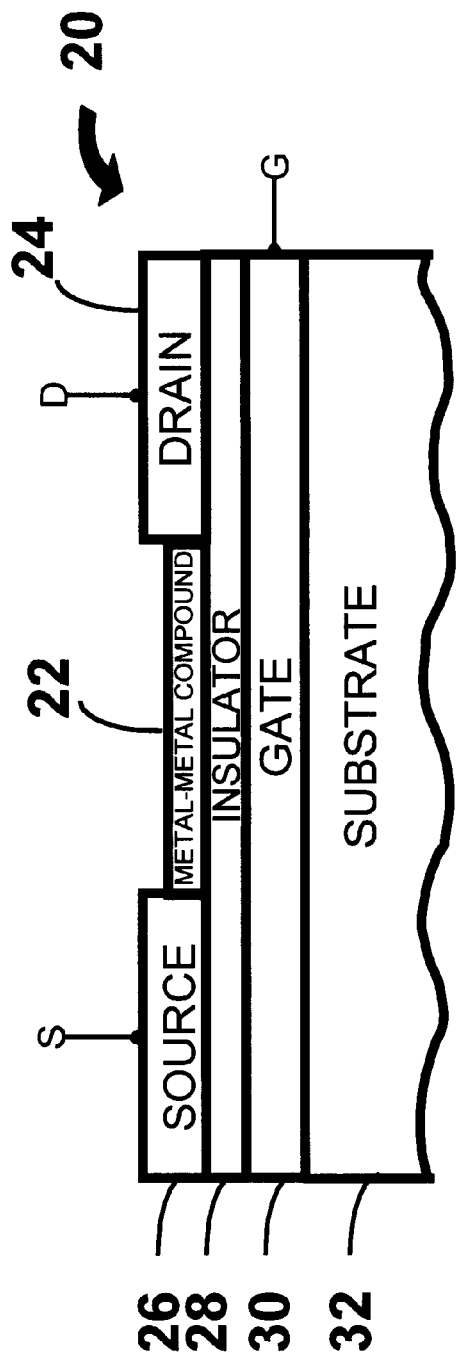
FIG. 2 shows a 3-terminal lateral device structure incorporating a metal—metal bonded layer as the active switching medium between source and drain electrodes and separated from the gate electrode by an insulator.

FIG. 2 shows a cross-sectional view of a typical three-terminal lateral electronic device 20 in the configuration of a transistor. The transistor 20 includes a metal—metal bonded material layer 22. Layer 22 is a metal—metal bonded complex and serves as the channel between source and drain electrodes 24 and 26. The conductance of the metal—metal bonded complex is modulated across an electrically insulating layer 28, such as a thin $SiO_2$ film, by a gate electrode 30, which may be a degenerately doped silicon layer, all of which are fabricated on substrate 32.

Figure 3:
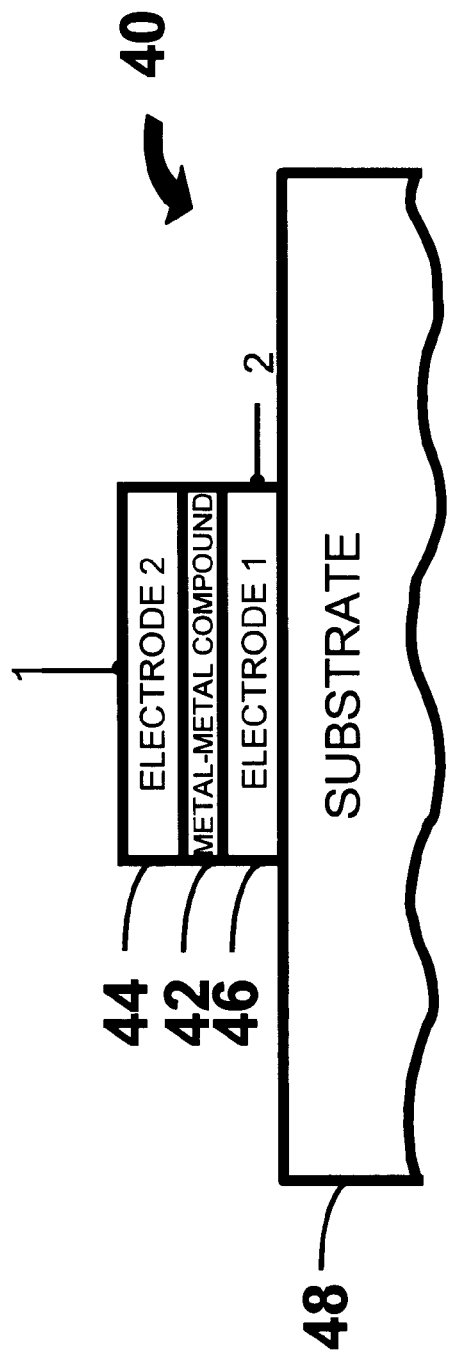
FIG. 3 shows a 2-terminal vertical device structure incorporating a metal—metal bonded layer as the active switching medium between two electrodes.

FIG. 3 shows a cross-sectional view of a typical two-terminal vertical electronic device 40. Device 40 includes a metal—metal bonded complex material layer 42. Layer 42 is a metal—metal bonded complex and serves as the active switching medium between electrodes 44 and 46 fabricated on substrate 48. In this case, electrode 44 is deposited on top of the metal—metal bonded layer.

Figure 4:
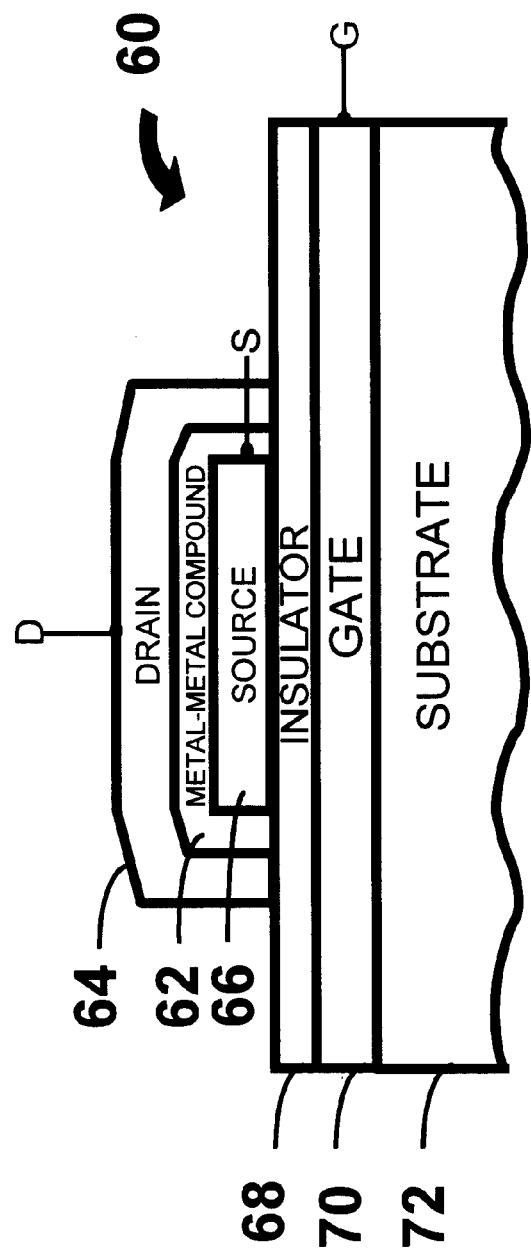
FIG. 4 shows a 3-terminal vertical device structure incorporating a metal—metal bonded layer as the active switching medium between source and drain electrodes and separated from the gate electrode by an insulator.

FIG. 4 shows a cross-sectional view of a typical three-terminal veritcal electronic device 60 in the configuration of a transistor. The transistor 60 includes a metal—metal bonded material layer 62. Layer 62 is a metal—metal bonded complex and serves as the channel between source and drain electrodes 64 and 66. The conductance of the metal—metal bonded complex is modulated across an electrically insulating layer 68, such as a thin $SiO_2$ film, by a gate electrode 70, which may be a degenerately doped silicon layer, all of which are fabricated on substrate 72. In this case, electrode 64 is deposited on top of the metal—metal bonded layer.

Figure 5:
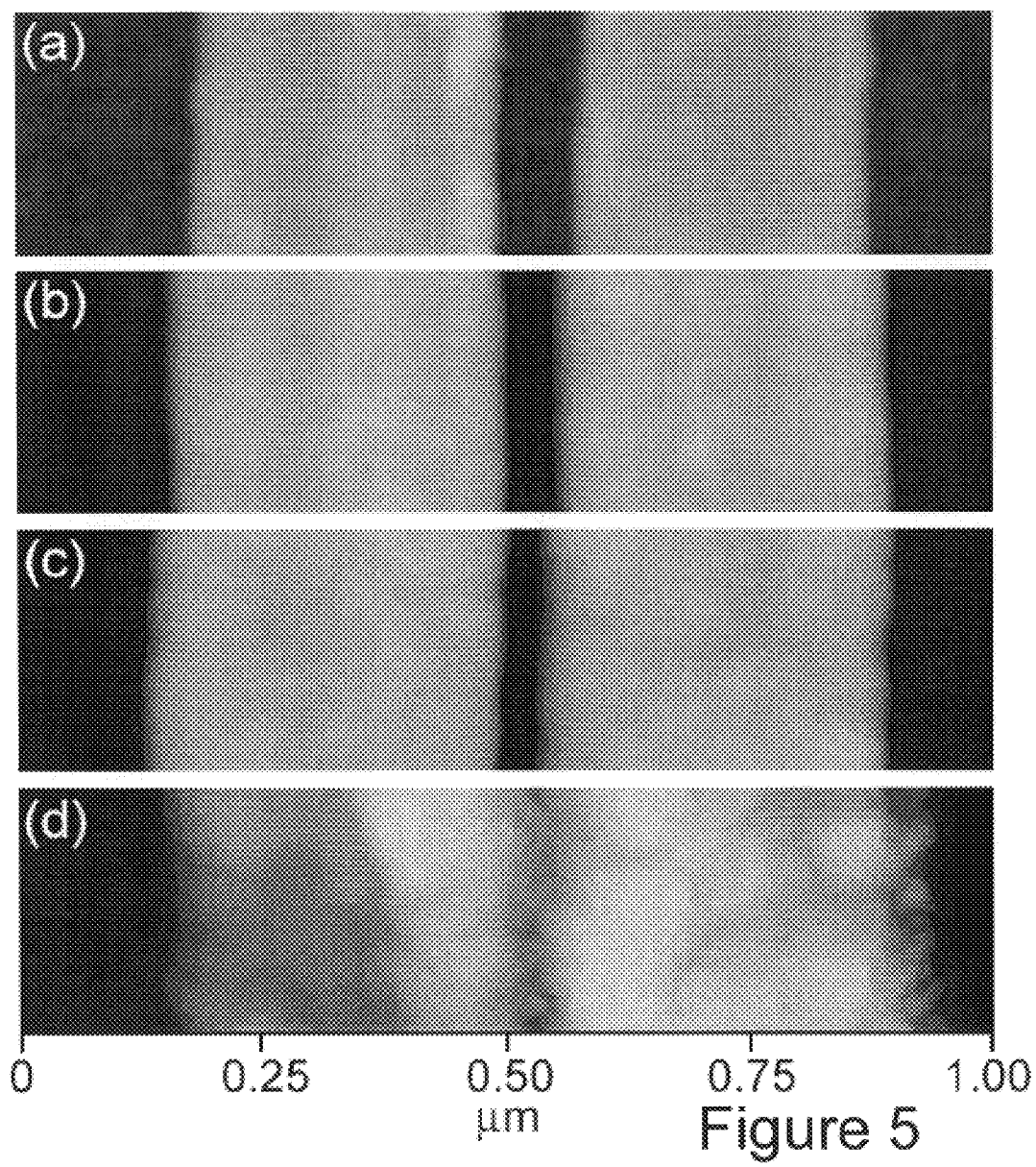
FIG. 5 shows an atomic force microscope images showing the layer-by-layer growth of the metal—metal bonded complex where Rh—Rh is the metal—metal bond and 1,2-bis(4-pyridyl)ethylene is the ligand.

FIG. 5 shows AFM images of metal—metal bonded complex assembled layer-by-layer from solution showing the complex spanning the distance between Au electrodes as the number of bilayers is increased from (a) 0 bilayers, (b) 7 bilayers, (c) 17 bilayers, and (d) 30 bilayers. The Au electrodes were deposited onto 40 nm thick $SiO_2$ on a degenerately doped silicon substrate.

Figure 6:
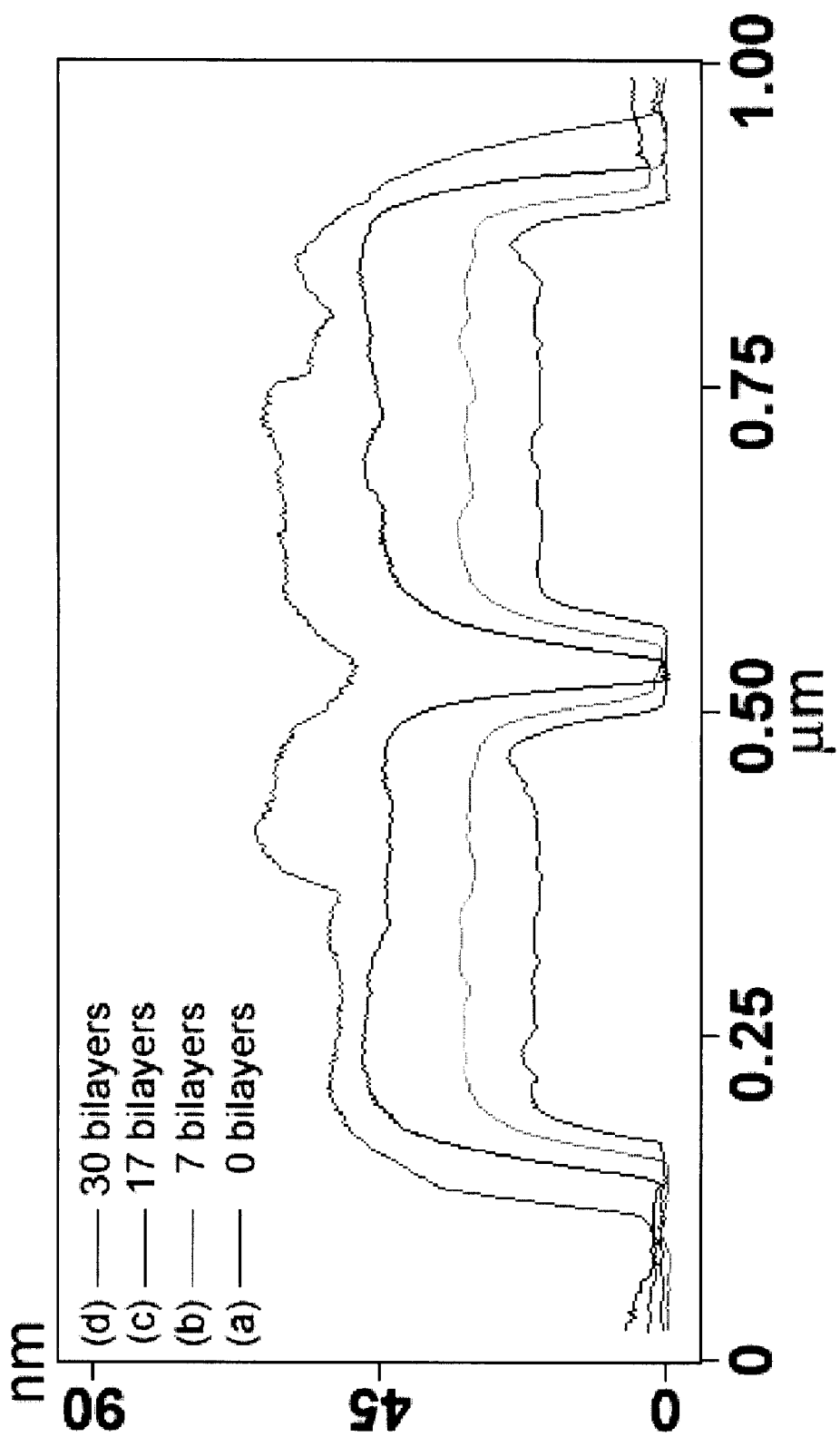
FIG. 6 shows an atomic force microscope cross-sections showing the layer-by-layer growth of the metal—metal bonded complex where Rh—Rh is the metal—metal bond and 1,2-bis(4-pyridyl)ethylene is the ligand. (corresponds to images in FIG. 1). The distance between the metal electrodes is shown in (a) before layer-by-layer growth of the metal—metal bonded complex. The metal—metal bonded complex grows off the metal electrodes, narrowing the measured gap, and spans the spacing between electrodes as the number of metal—metal bonded and ligand layers are increased as shown for (b) 7 bilayers (where 1 bilayer is a metal—metal bonded layer and a ligand layer), (c) 17 bilayers, and (d) 30 bilayers. Once the spacing between the electrodes is spanned by the metal—metal bonded complex, the I–V characteristics in FIG. 7 and FIG. 8 are attained showing the electrical connection and negative differential resistance.

FIG. 6 shows line-cuts of the AFM images shown in FIG. 5. The metal—metal bonded complex spans the distance between electrodes, closing the separation between electrodes as the number of bilayers is increased from (a) 0 bilayers, (b) 7 bilayers, (c) 17 bilayers, and (d) 30 bilayers.

Once the metal—metal bonded complex spans the distance between electrodes, either by assembling the complex layer-by-layer or by spin-coating a polycrystalline thin film in which the metal—metal bonded units and the organic ligands self-assemble, the electrodes are electrically connected.

Figure 7:
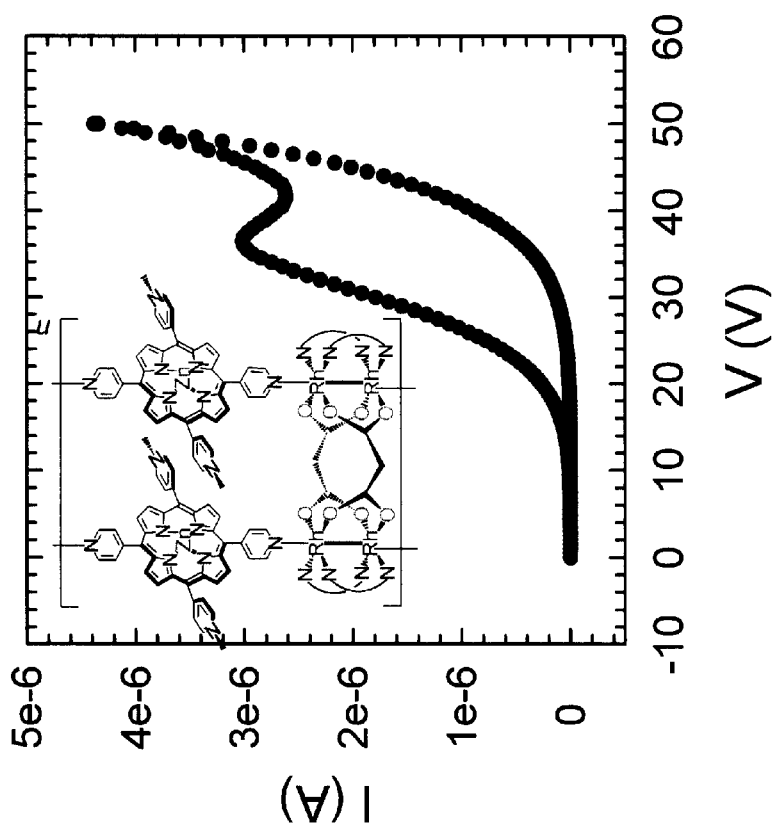
FIG. 7 shows room temperature I–V characteristics of a metal—metal bonded complex where Rh—Rh is the metal—metal bond and zinc 5,10,15,20-tetra(4-pyridyl)-21H,23H-porphine is the ligand. The complex was grown layer-by-layer from Au electrodes using mercaptan ethylpyridine as the linker. The device is fabricated in the lateral geometry with an 80 nm spacing between metal electrodes. The electrodes were deposited onto 40 nm thick $SiO_2$ on a degenerately doped silicon substrate.
Figure 8:
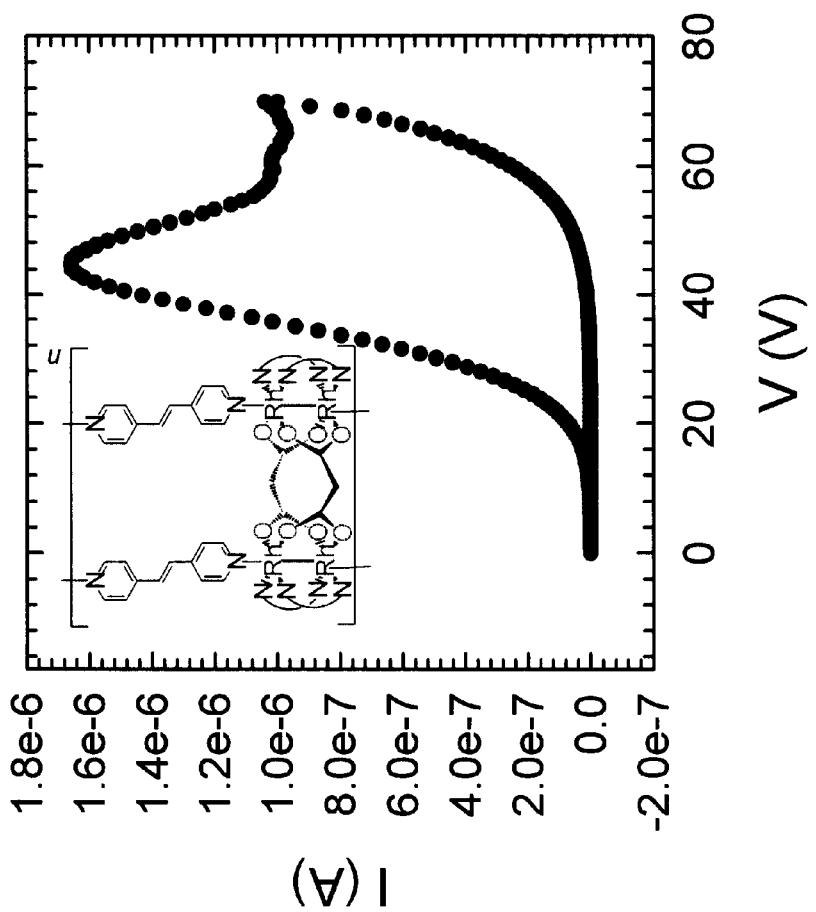
FIG. 8 shows room temperature. I–V characteristics of a metal—metal bonded complex where Rh—Rh is the metal—metal bond and 1,2-bis(4-pyridyl)ethylene is the ligand. The film was grown layer-by-layer from Au electrodes using mercaptan ethylpyridine as the linker. The device is fabricated in the lateral geometry with an 80 nm spacing between metal electrodes. The electrodes were deposited onto 40 nm thick $SiO_2$ on a degenerately doped silicon substrate.
Figure 9:
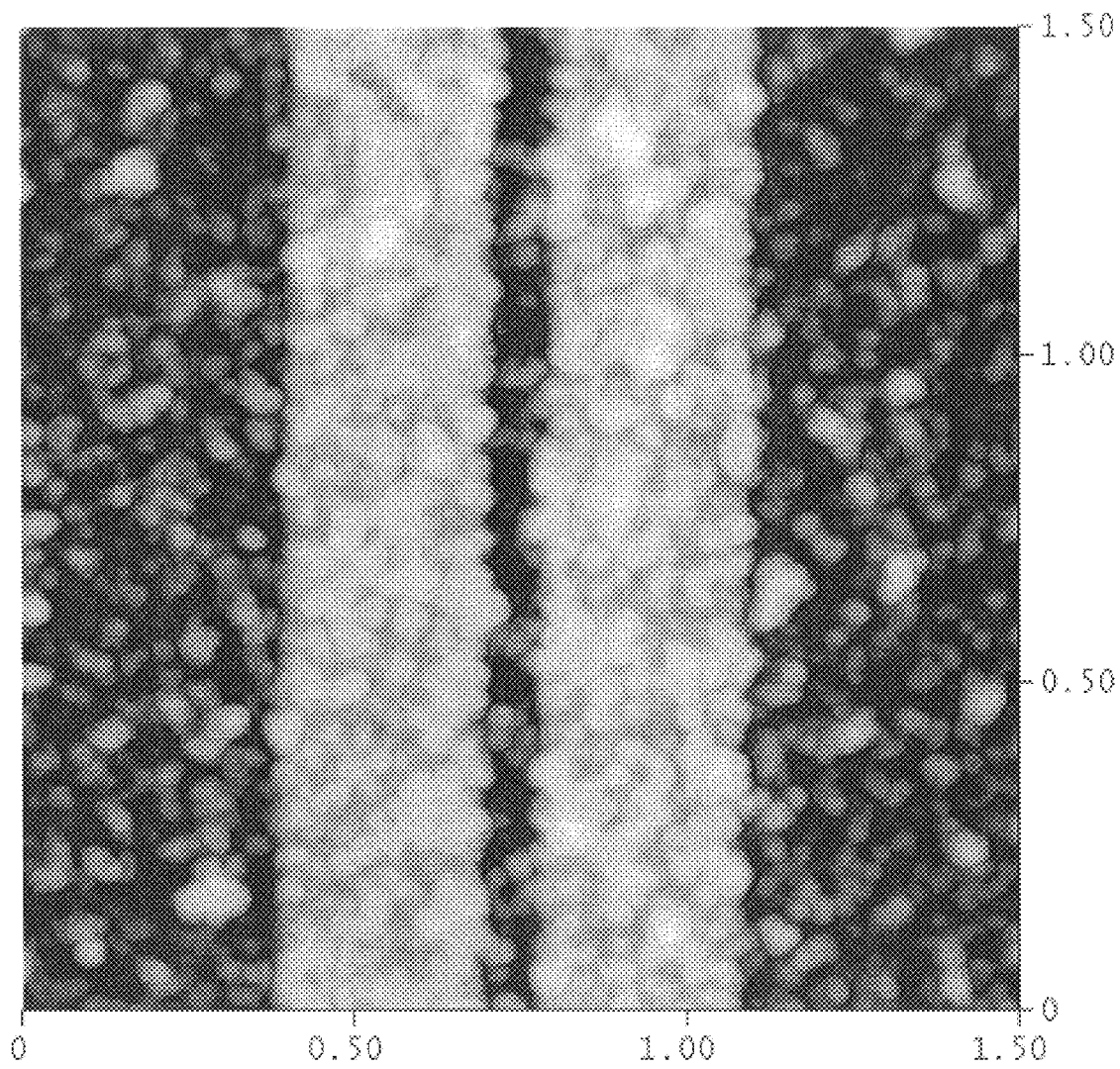
FIG. 9 shows an atomic force microscope images of a spin-coated polycrystalline thin film of the metal—metal bonded complex where Rh—Rh is the metal—metal bond and zinc 5, 10, 15,20-tetra(4-pyridyl)-21H,23H-porphine is the ligand. The complex was deposited onto Au electrodes that were deposited on top of an $SiO_2$ on degenerately doped silicon substrate.
Figure 10:
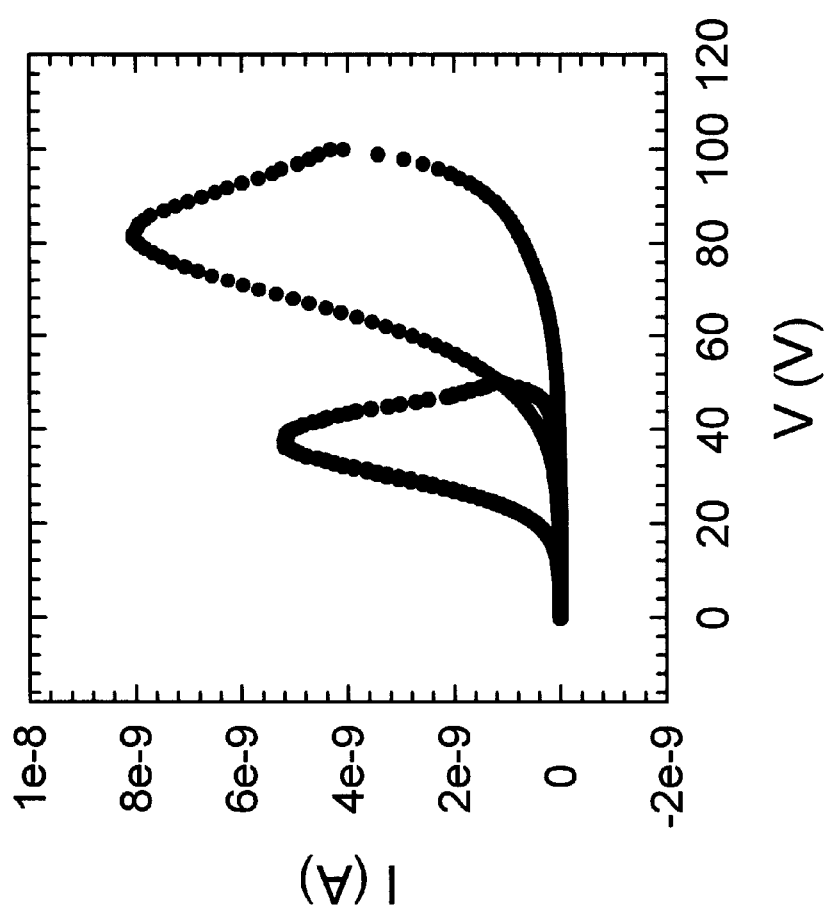
FIG. 10 shows room temperature I–V characteristics of a metal—metal bonded complex where Rh—Rh is the metal—metal bond and zinc 5,10,15,20-tetra(4-pyridyl)-21H,23H-porphine is the ligand. The complex was deposited on top of the device structures having Au electrodes. The devices are fabricated in the lateral geometry with (A) a 80 nm spacing and (B) a 295 nm spacing between metal electrodes. The electrodes were deposited onto 40 nm thick $SiO_2$ on a degenerately doped silicon substrate.

Preliminary data demonstrating the desired negative differential resistance in 2-terminal, lateral device structures is shown for two metal—metal bonded complexes in FIGS. 7 and 8, where the compound is assembled layer-by-layer, and in FIGS. 9 and 10, where the compound is deposited by spin-coating from a solution in chloroform (1.6 mg/mL) for 1 minute at spin speeds between 1500–2000 rpm.

FIG. 7 shows negative differential resistance in the I–V characteristics for a metal—metal bonded complex in which Rh—Rh is the metal—metal bonded unit and zinc 5,10,15,20-tetra(4-pyridyl)-21H,23H-porphine is the ligand. The complex was grown layer-by-layer from Au electrodes using mercaptan ethylpyridine as the linker. The device is fabricated in the lateral geometry with an 80 nm spacing between metal electrodes.

FIG. 8 shows negative differential resistance in the I–V characteristics for a metal—metal bonded complex in which Rh—Rh is the metal—metal bonded unit and 1,2-bis(4-pyridyl)ethylene is the ligand. The compound was grown layer-by-layer from Au electrodes using mercaptan ethylpyridine as the linker. The device is fabricated in the lateral geometry with an 80 nm spacing between metal electrodes.

FIG. 9 shows an AFM image of the metal—metal bonded complex in which Rh—Rh is the metal—metal bonded unit and zinc 5,10,15,20-tetra(4-pyridyl)-21H,23H-porphine is the ligand. The complex was deposited by spin-coating from a solution in chloroform to form a polycrystalline thin film with grain structure consistent with the underlying structural motif of the metal—metal bonded complex.

FIG. 10 shows negative differential resistance in the I–V characteristics for a metal—metal bonded complex in which Rh—Rh is the metal—metal bonded unit and zinc 5,10,15,20-tetra(4-pyridyl)-21H,23H-porphine is the ligand. The complex was deposited by spin-coating from a solution in chloroform.

Figure 11:
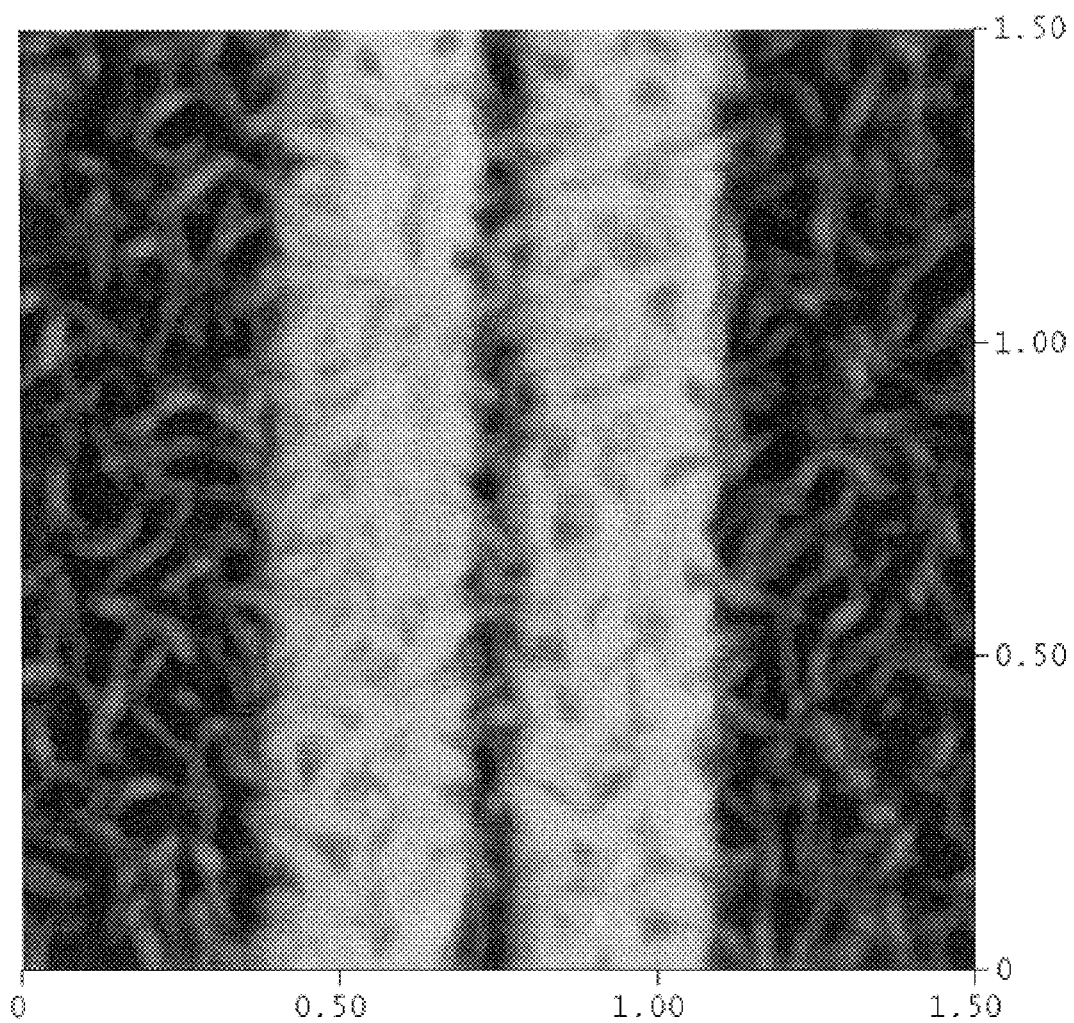
FIG. 11 shows an atomic force microscope images of a spin-coated polycrystalline thin film of the metal—metal bonded complex where Rh—Rh is the metal—metal bond and 1,2-bis(4-pyridyl)ethylene is the ligand. The complex was deposited onto Au electrodes that were deposited on top of an $SiO_2$ on degenerately doped silicon substrate.

FIG. 11 shows an AFM image of the metal—metal bonded complex in which Rh—Rh is the metal—metal bonded unit and 1,2-bis(4-pyridyl)ethylene is the ligand. The complex was deposited by spin-coating from a solution in chloroform to form a polycrystalline thin film with grain structure consistent with the underlying structural motif of the metal—metal bonded complex.

Figure 12:
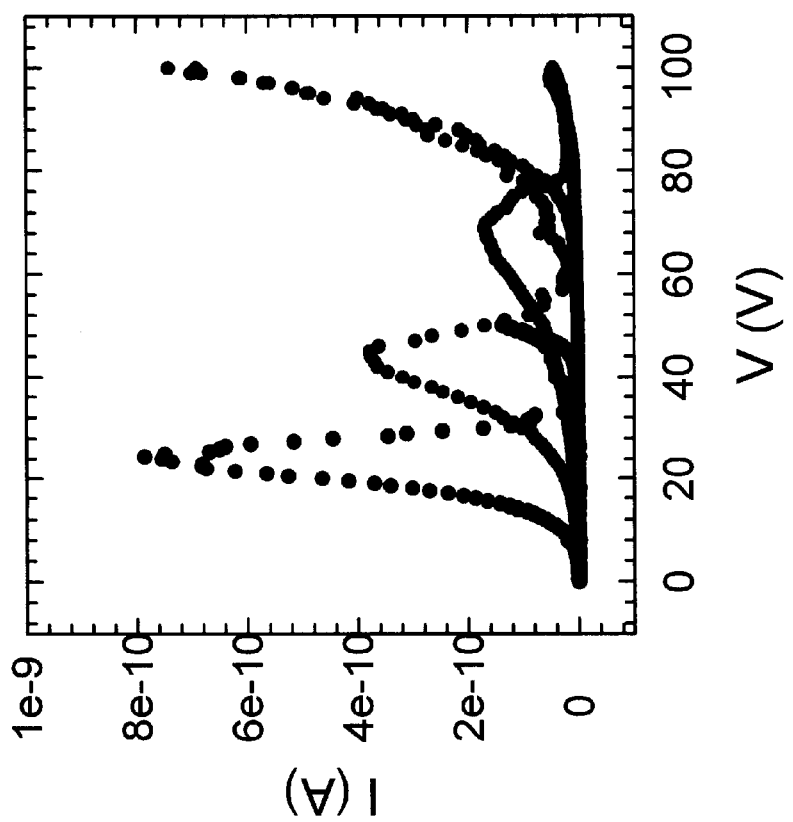
FIG. 12 shows room temperature I–V characteristics of a metal—metal bonded complex where Rh—Rh is the metal—metal bond and 1,2-bis(4-pyridyl)ethylene is the ligand. The complex was deposited on top of the device structures having Au electrodes by spin-coating. The devices are fabricated in the lateral geometry with (A) an 80 nm spacing, (B) a 295 nm spacing, (C) a 385 nm spacing between metal electrodes. The electrodes were deposited onto 40 nm thick $SiO_2$ on a degenerately doped silicon substrate.

FIG. 12 shows negative differential resistance in the I–V characteristics for a metal—metal bonded complex in which Rh—Rh is the metal—metal bonded unit and 1,2-bis(4-pyridyl)ethylene is the ligand. The complex was deposited by spin-coating from a solution in chloroform.

The electronic properties of the metal—metal bonded complexes may be tailored through chemistry. There is a wide-range of metal—metal and organic ligands usable as the metal—metal bonded complex. Metal—metal bonded complexes may be designed by choosing the chemistry and structural motif of the complex. The flexibility in the chemistry may be used to tailor the electronic properties of the molecular devices.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A molecular device comprising:
   a source region and a drain region;
   a molecular medium extending between said source region and said drain region; said molecular medium comprising a thin film having alternating monolayers of a metal—metal bonded complex monolayer and an organic monolayer; and
   an electrically insulating layer between said source region, said drain region and said molecular medium.

2. The molecular device of claim 1, wherein said source region and said drain region are electrodes.

3. The molecular device of claim 1, wherein said electrodes and said molecular medium are disposed on a substrate.

4. The molecular device of claim 1, further comprising a gate region disposed in spaced adjacency to said molecular medium.

5. The molecular device of claim 4, wherein said gate region is disposed on a substrate and below said insulating layer.

6. The molecular device of claim 1, wherein said source region, said drain region and said molecular medium are disposed on said insulating layer, and wherein said insulating layer is disposed on said substrate.

7. The molecular device of claim 1, wherein said source region, said drain region and said molecular medium disposed there between are disposed in a vertical arrangement on an insulating material, which is disposed on said substrate.

8. The molecular device of claim 7, further comprising a gate region disposed between said substrate and said source region, said drain region and said molecular medium.

9. The molecular device of claim 1, wherein said molecular medium is a molecular switching medium.

10. The molecular device of claim 1, wherein said thin film is prepared by a process comprising the steps of:

(1) applying onto a surface of a substrate a first linker compound represented by the formula:

G1-Linker$_a$-G2 to produce a primer layer of said first linker compound on said substrate, wherein G1 is a functional group capable of interacting with said surface of said substrate; G2 is a functional group capable of interacting with a metal—metal bonded complex; and Linker$_a$ is a difunctional organic group bonded to G1 and G2;

(2) applying onto said primer layer a layer of a metal—metal bonded complex to produce a metal—metal bonded complex monolayer on said primer layer; said metal—metal bonded complex being selected from the group consisting of compounds represented by the following formulas:

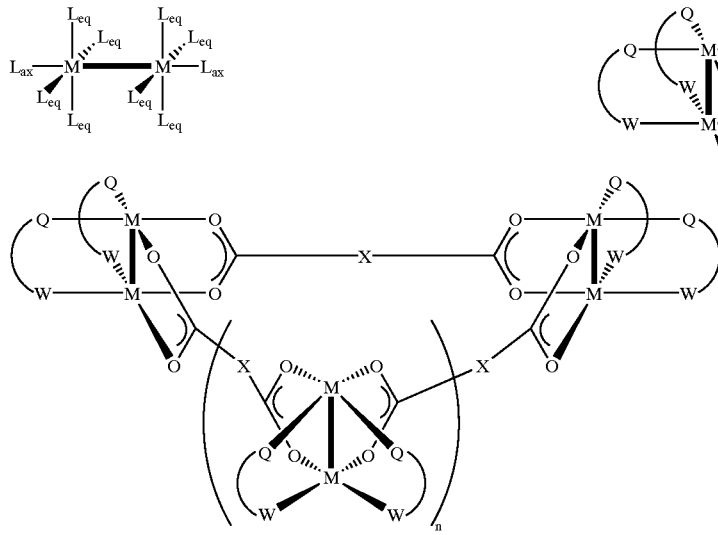

and a combination thereof; wherein:

$L_{ax}$ is an axial ligand;

$L_{eq}$ is an equatorial ligand; wherein two equatorial ligands together form a bidentate ligand

wherein each

is independently selected from the group consisting of:

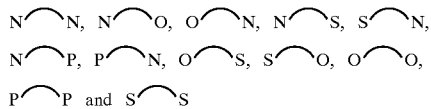

ligands;

M is a transition metal;

wherein

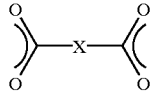

is a bridging group each selected independently from the group consisting of: $SO_4^{2-}$, $MoO_4^{2-}$, $WO_4^{2-}$, $ZnCl_4^{2-}$ and a dicarboxylate; and wherein m is an integer from 1 to 25, and n is 0 to 6;

(3) applying onto said metal—metal bonded complex monolayer a second linker compound represented by the formula:

G3-Linker$_b$-G4 to produce on said metal—metal bonded complex monolayer an organic monolayer; wherein G3 and G4 are the same or different functional groups capable of interacting with a metal—metal bonded complex; and Linker$_b$ is a single bond or a difunctional organic group bonded to G3 and G4; and optionally (4) sequentially repeating steps (2) and (3) at least once to produce said layer-by-layer grown thin film having alternating monolayers of a metal—metal bonded complex monolayer and an organic monolayer.

11. The molecular device of claim 10, wherein said transition metal in said metal—metal bonded complex is selected from the group consisting of: $Cr_2^{4+}$, $Mo_2^{4+}$, $Re_2^{6+}$, $Re_2^{5+}$, $Re_2^{4+}$, $Ru_2^{5+}$, $Ru_2^{6+}$, $Rh_2^{4+}$ and a combination thereof.

12. The molecular device of claim 10, wherein said substrate is selected from the group consisting of: a metal, a metal oxide, a semiconductor material, a metal alloy, a semiconductor alloy, a polymer, an organic solid and a combination thereof.

13. The molecular device of claim 12, wherein said substrate is selected from the group consisting of: Au (gold), ITO (indium titanium oxide), SiO$_2$ (silicon dioxide) and an electrode.

14. The molecular device of claim 10, wherein said thin film has from 1 to 100 alternating monolayers of a metal—metal bonded complex monolayer and an organic monolayer.

15. The molecular device of claim 1, wherein said thin film is prepared by a process comprising the steps of:
(a) applying onto a surface of a substrate a solution comprising:
(i) a metal—metal bonded complex selected from the group consisting of compounds represented by the following formulas:

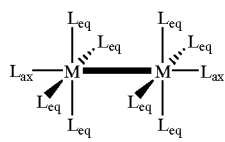

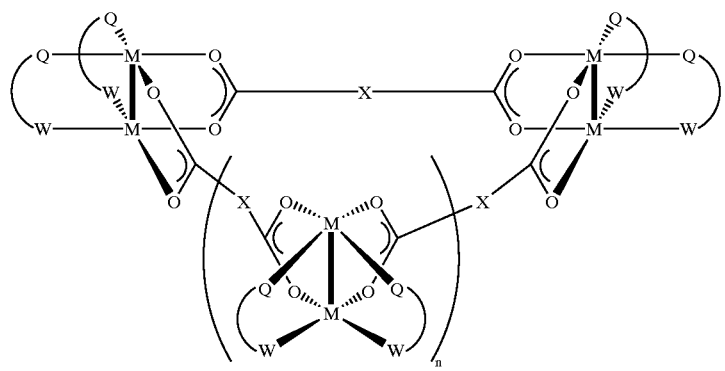

and a combination thereof; wherein:

$L_{ax}$ is an axial ligand;

$L_{eq}$ is an equatorial ligand; wherein two equatorial ligands together form a bidentate ligand

wherein each

is independently selected from the group consisting of:

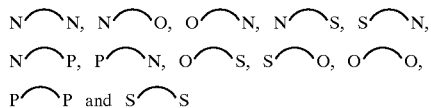

ligands;

M is a transition metal;
wherein

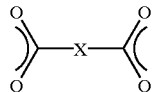

is a bridging group each selected independently from the group consisting of: $SO_4^{2-}$, $MoO_4^{2-}$, $WO_4^{2-}$, $ZnCl_4^{2-}$ and a dicarboxylate; and
wherein m is an integer from 1 to 25, and n is 0 to 6;

(ii) a linker compound represented by the formula:

G3-Linker$_b$-G4 wherein G3 and G4 are the same or different functional groups capable of interacting with a metal—metal bonded complex; and Linker$_b$ is a single bond or a difunctional organic group bonded to G3 and G4; and (iii) a solvent; and

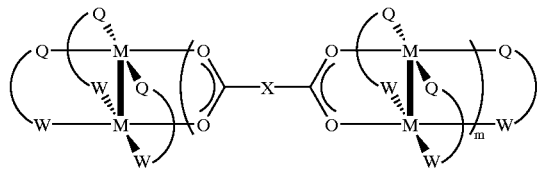

(b) evaporating said solvent to produce a thin film of molecular medium on said substrate.

16. A molecular device comprising:
a source region and a drain region;
a molecular medium extending between said source region and said drain region, said molecular medium comprising a thin film having alternating monolayers of a metal—metal bonded complex monolayer and an organic monolayer prepared by layer-by-layer growth;
a gate region disposed in spaced adjacency to said molecular medium, and
an electrically insulating layer between said gate region and said source region, said drain region and said molecular medium.

17. The molecular device of claim 16, wherein said source region, molecular medium and drain region are disposed upon a surface of a substrate, said electrically insulating layer is disposed over said molecular medium and extending from said source region to said drain region, and said gate region is disposed over said electrically insulating layer.

18. The molecular device of claim 16, herein said gate region is disposed as a gate layer upon a surface of a substrate, said electrically insulating layer is disposed upon said gate layer, and said source region, molecular medium, and drain region are disposed upon said electrically insulating layer.

19. The molecular device of claims 17, wherein said substrate comprises a flexible material.

20. The molecular device of claim 19, wherein said flexible material comprises a plastic material.

21. The molecular device of claim 16, wherein said molecular medium is a molecular switching medium.

22. The molecular device of claim 16, wherein said molecular medium comprises a thin film having alternating monolayers of a metal—metal bonded complex monolayer and an organic monolayer.

23. The molecular device of claim 22, wherein said thin film is prepared by a process comprising the steps of:

(1) applying onto a surface of a substrate a first linker compound represented by the formula:

G1-Linker$_a$-G2 to produce a primer layer of said first linker compound; wherein G1 is selected from the group consisting of: $Cl_3Si$ and SH; G2 is selected from the group consisting of: 4-pyridyl and 4-cyanophenyl; and Linker$_a$ is selected from the group consisting of: $C_1$–$C_8$ alkylene, $C_1$–$C_8$ alkenediyl, $C_1$–$C_8$ alkynediyl and 1,4-arylene;

(2) applying onto said primer layer a metal—metal bonded complex to produce on said primer layer a metal—metal bonded complex monolayer; wherein said metal—metal bonded complex is selected from the group consisting of compounds represented by the following formulas:

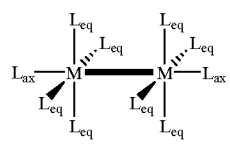

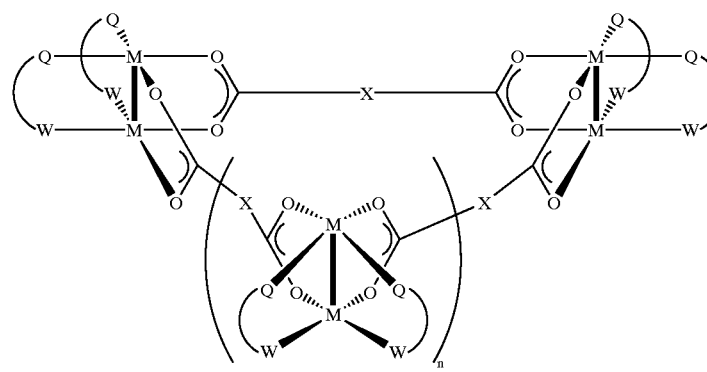

and a combination thereof; wherein:

$L_{ax}$ is an axial ligand;

$L_{eq}$ is an equatorial ligand; wherein two equatorial ligands together form a bidentate ligand

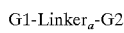

wherein each

Q⌢W is independently selected from the group consisting of:

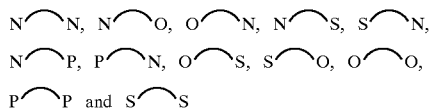

ligands;

M is a transition metal;

wherein the group

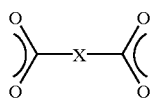

is a dicarboxylate bridging group selected from the group consisting of compounds represented by the formulas:

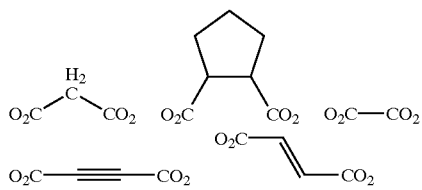

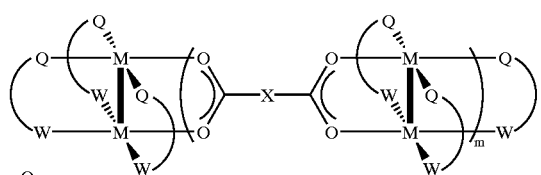

-continued

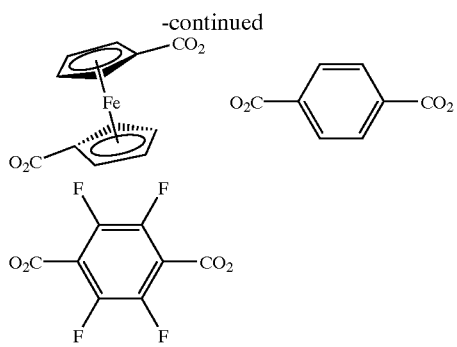

-continued

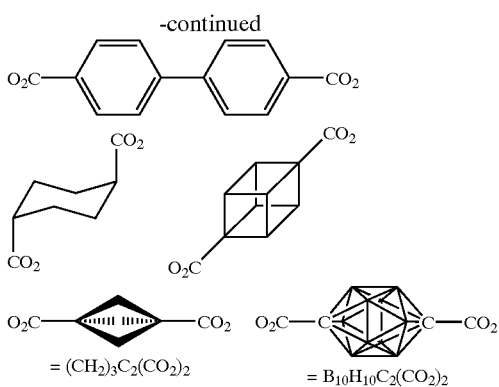

= $(CH_2)_3C_2(CO_2)_2$          = $B_{10}H_{10}C_2(CO_2)_2$ and mixtures thereof; and
wherein m is an integer from 1 to 12, and n is 0 to 3;
(3) applying onto said metal—metal bonded complex monolayer a second linker compound represented by the formula:

G3-Linker$_b$-G4 to produce on said metal—metal bonded complex monolayer an organic monolayer; wherein G3 and G4 are the same or different functional groups capable of interacting with a metal—metal bonded complex; and Linker$_b$ is a single bond or a difunctional organic group bonded to G3 and G4; and optionally (4) sequentially repeating steps (2) and (3) at least once to produce said layer-by-layer grown thin film having alternating monolayers of a metal—metal bonded complex monolayer and an organic monolayer.

24. The molecular device of claim 23, wherein said transition metal in said metal—metal bonded complex is selected from the group consisting of: $Cr_2^{4+}$, $Mo_2^{4+}$, $Re_2^{6+}$, $Re_2^{5+}$, $Re_2^{4+}$, $Ru_2^{5+}$, $Ru_2^{6+}$, $Rh_2^{4+}$ and a combination thereof.

25. A molecular device comprising:
a source region and a drain region;
a molecular medium extending between said source region and said drain region, said molecular medium comprising a thin film having alternating monolayers of a metal—metal bonded complex monolayer and an organic monolayer; and
an electrically insulating layer between said source region, said drain region and said molecular medium.

26. The molecular device of claim 25, further comprising a gate region disposed in spaced adjacency to said molecular medium.

* * * * *